United States Patent
Jung

(10) Patent No.: US 7,635,412 B2
(45) Date of Patent: Dec. 22, 2009

(54) CRYSTALLIZING SILICON USING A LASER BEAM TRANSMITTED THROUGH A MASK

(75) Inventor: Yun Ho Jung, Seoul (KR)

(73) Assignee: LG Display Co., Ltd., Seoul (KR)

( * ) Notice: Subject to any disclaimer, the term of this patent is extended or adjusted under 35 U.S.C. 154(b) by 119 days.

(21) Appl. No.: 10/872,486

(22) Filed: Jun. 22, 2004

(65) Prior Publication Data

US 2005/0040148 A1 Feb. 24, 2005

(30) Foreign Application Priority Data

Aug. 18, 2003 (KR) ............... 10-2003-0056930

(51) Int. Cl.
*C30B 1/08* (2006.01)
*C30B 21/04* (2006.01)

(52) U.S. Cl. ............... 117/8; 219/121.66; 438/487

(58) Field of Classification Search ............ 219/121.65, 219/121.66, 121.73, 121.78; 438/166, 486, 438/795; 257/797; 117/3, 8
See application file for complete search history.

(56) References Cited

U.S. PATENT DOCUMENTS

| | | | | |
|---|---|---|---|---|
| 4,941,741 A | * | 7/1990 | Mizuta | 351/221 |
| 6,506,635 B1 | * | 1/2003 | Yamazaki et al. | 438/148 |
| 6,573,163 B2 | * | 6/2003 | Voutsas et al. | 438/487 |
| 6,607,527 B1 | * | 8/2003 | Ruiz et al. | 606/41 |
| 6,726,768 B2 | * | 4/2004 | Yoon | 117/103 |
| 6,755,909 B2 | * | 6/2004 | Jung | 117/4 |
| 6,767,804 B2 | * | 7/2004 | Crowder | 438/487 |
| 6,861,614 B1 | * | 3/2005 | Tanabe et al. | 219/121.66 |
| 7,056,629 B2 | * | 6/2006 | Crowder | 430/5 |
| 7,105,048 B2 | * | 9/2006 | Yamazaki et al. | 117/3 |
| 7,115,168 B2 | * | 10/2006 | Grantham et al. | 118/720 |
| 7,205,203 B2 | * | 4/2007 | Kim | 438/401 |
| 7,357,963 B2 | * | 4/2008 | Jung | 427/554 |

(Continued)

FOREIGN PATENT DOCUMENTS

| | | | | |
|---|---|---|---|---|
| JP | 406320292 | A | * | 11/1994 |
| JP | 409266325 | A | * | 10/1997 |
| JP | 02000343257 | A | * | 12/2000 |

(Continued)

*Primary Examiner*—Samuel M Heinrich
(74) *Attorney, Agent, or Firm*—McKenna Long & Aldridge LLP

(57) ABSTRACT

An laser crystallization device and a method for crystallizing silicon by using the same is disclosed, to carry out the crystallization process at both the X-axis and Y-axis directions without rotation of a stage, wherein the laser crystallization device is includes a mask including first and second regions, the first region having an open part oriented in the X-axis direction, and the second region having an open part oriented in the Y-axis direction. A crystallization method includes positioning a substrate having an amorphous silicon layer on a stage; arranging a mask corresponding to the substrate to form first and second crystallizing blocks on irradiation of laser beam, the mask including a first region having a plurality of open parts oriented along the X-axis direction, and a second region having a plurality of open parts oriented along the Y-axis direction; crystallizing the substrate along the X-axis direction when the first region is open, and the stage is moved along the X-axis direction; and crystallizing the substrate along for the Y-axis direction of when the second region is open, and the stage is moved along the Y-axis direction.

7 Claims, 12 Drawing Sheets

U.S. PATENT DOCUMENTS

| | | | |
|---|---|---|---|
| 7,384,476 B2 * | 6/2008 | You | 117/8 |
| 2003/0040146 A1 * | 2/2003 | Kang et al. | 438/166 |
| 2003/0060026 A1 * | 3/2003 | Yamazaki et al. | 438/479 |
| 2003/0142321 A1 * | 7/2003 | Hattori | 356/500 |
| 2004/0201019 A1 * | 10/2004 | Kim et al. | 257/59 |
| 2004/0266146 A1 * | 12/2004 | Jung | 438/487 |
| 2005/0056623 A1 * | 3/2005 | Jung | 219/121.65 |
| 2005/0142450 A1 * | 6/2005 | Jung | 430/5 |
| 2005/0271952 A1 * | 12/2005 | Jung | 430/5 |
| 2006/0040512 A1 * | 2/2006 | Im | 438/795 |

FOREIGN PATENT DOCUMENTS

| | | |
|---|---|---|
| KR | 2002-0091352 A | 12/2002 |
| KR | 2003-031496 | 1/2003 |
| KR | 2003-100635 | 4/2003 |

* cited by examiner

CRYSTALLIZING SILICON USING A LASER BEAM TRANSMITTED THROUGH A MASK

This application claims the benefit of the Korean Application No. P2003-56930, filed on Aug. 18, 2003, which is hereby incorporated by reference.

BACKGROUND OF THE INVENTION

1. Field of the Invention

The present invention relates to a liquid crystal display (LCD) device, and more particularly, to a method for crystallizing silicon in both the X-axis and Y-axis directions without a rotation of a stage.

2. Discussion of the Related Art

As information technologies develop, various displays are in demand. Recently, many efforts have been made to research and develop various flat display panels such as a liquid crystal display (LCD), a plasma display panel (PDP), an electroluminescent display (ELD), a vacuum fluorescent display (VFD), and the like. Some types of the flat display panels have already been applied to various display devices.

LCD devices are widely used because of their characteristics and advantages, including high quality images, lightweight, thin and compact size, and low power consumption so as to be used in place of cathode ray tubes (CRT) for mobile image display devices. An LCD device has also been developed to receive broadcast signals to display, such as a television, a computer monitor, and the like.

Even if there are significant developments in LCD the technology for an image display in various fields, the image quality fails to meet the characteristics and advantages of an LCD display. In order to use a liquid crystal display device as a display device in various applications, development of an LCD device depends on realizing high image qualities, such as high resolution, high brightness, wide screen, and the like, as well as maintaining the characteristics of lightweight, compactness, and low power consumption.

An LCD display device includes an LCD panel displaying an image and a driving unit that applies driving signals to the LCD panel. The LCD panel includes first and second glass substrates bonded to each other so as to secure a space therebetween, and a liquid crystal layer is injected between the first and second glass substrates.

Formed on the first glass substrate (TFT array substrate) are a plurality of gate lines arranged in one direction at fixed intervals a plurality of data lines arranged in a direction substantially perpendicular to the gate lines at fixed intervals, a plurality of pixel electrodes in pixel areas defined by the gate and data lines crossing each other, and a plurality of thin film transistors switched by signals on the gate lines to transfer signals of the data lines to the pixel electrodes. Formed on the second glass substrate (color filter substrate) are a black matrix layer that shields light in areas outside the pixel areas, an R/G/B color filter layer for realizing colors, and a common electrode for producing an image.

The above-described first and second substrates are separated from each other by spacers to provide a space therebetween, and are bonded to each other through a sealant having a liquid crystal injection inlet. Further, liquid crystal is injected between the two substrates. At this time, the liquid crystal injection method is carried out by maintaining a vacuum state within the gap between the two substrates bonded by the sealant. Then, the liquid crystal injection inlet is dipped in a vessel containing liquid crystal, so as to allow the liquid crystal to be injected into the gap between the two substrates by osmosis. After the liquid crystal is injected as described above, the liquid crystal injection inlet is sealed with an air-tight sealant.

The operating principle of a general liquid crystal display device uses the optical anisotropy and polarization characteristic of liquid crystal. Because of the thin and long structure of liquid crystal, the liquid crystal molecules are aligned to have a specific direction. Also, the direction of the alignment may be controlled by applying an induced electric field to the liquid crystal molecules. Therefore, when the alignment of the liquid crystal molecules is arbitrarily controlled, the alignment of the liquid crystal molecules is eventually altered. Subsequently, due to the optical anisotropy of liquid crystal, light rays are refracted in the direction of the alignment of the liquid crystal molecules, thereby producing image information.

Among current technologies, the active matrix liquid crystal display (LCD), which is formed of a thin film transistor and pixel electrodes aligned in a matrix and connected to the thin film transistor, is considered to be excellent for its high resolution and its ability to represent moving images.

A poly-silicon, having a high electric field mobility and low photocurrent, may be used to form a semiconductor layer of the above-described thin film transistor. The method for fabricating a poly-silicon can be divided into a low temperature fabrication process and a high temperature fabrication process depending upon the fabrication temperature.

The high temperature fabrication process requires a temperature condition approximate to 1000° C., which is equal to or higher than the temperature for modifying substrates. Accordingly, because glass substrates have poor heat-resistance, expensive quartz substrates having excellent heat-resistance should be used. And, when fabricating a poly-silicon thin film by using the high temperature fabrication process, deficient crystallization may occur due to high surface roughness and fine crystal grains, thereby resulting in deficient device application, as compared to the poly-silicon formed by the low temperature fabrication process. Therefore, technologies for crystallizing amorphous silicon, which can be vapor-deposited at a low temperature, to form a poly-silicon are being researched and developed.

The low temperature fabrication process can be categorized into laser crystallizing and metal induced crystallization processes. The laser crystallizing process includes irradiating a pulsed laser beam on a substrate. By using the pulsed laser beam, the solidification and condensation of the substrate can be repeated at a cycle unit of about 10 to $10^2$ nanoseconds. This low temperature fabrication process is known for having the advantage that the damage caused on a lower insulating substrate may be minimized.

The related art silicon crystallization method using laser crystallizing will now be explained in detail. FIG. 1 illustrates a graph showing sizes of amorphous silicon particles by laser energy density. As shown in FIG. 1, the crystallization characteristic of the amorphous silicon may be described as having a first region, a second region, and a third region depending upon the intensity of the laser energy.

The first region is a partial melting region, whereby the intensity of the laser energy irradiated on an amorphous silicon layer melts only the amorphous silicon layer. After the irradiation, the surface of the amorphous silicon layer is partially melted in the first region, whereby small crystal grains are formed on the surface of the amorphous silicon layer after a solidification process.

The second region is a near-to-complete melting region, whereby the intensity of the laser energy, being higher than that of the first region, almost completely melts the amorphous silicon. After the melting, the remaining nuclei are used as seeds for a crystal growth, thereby forming crystal particles with an increased crystal growth as compared to the first region. However, the crystal particles formed in the second region are not uniform. Also, the second region is narrower than the first region.

The third region is a complete melting region, whereby laser energy with increased intensity, as compared to that of the second region, is irradiated to completely melt the amorphous silicon layer. After the complete melting of the amorphous silicon layer, a solidification process is carried out, so as to allow a homogenous nucleation, thereby forming a crystal silicon layer formed of fine and uniform crystal particles.

In the method for fabricating poly-silicon, the number of laser beam irradiations and degree of overlap are controlled in order to form uniform, large and rough crystal particles by using the energy density of the second region. However, the interfaces between a plurality of poly-silicon crystal particles act as obstacles for the electric current flow, thereby decreasing the reliability of the thin film transistor device. In addition, collisions between electrons may occur within the plurality of crystal particles causing damage to the insulating layer due to the collision current and deterioration, thereby resulting in a performance degradation. In order to resolve such problems when using a method for fabricating a poly-silicon by sequential lateral solidification (SLS) crystallization, the crystal growth of the silicon crystal particle occurs at a surface interface between liquid silicon and solid silicon in a direction perpendicular to the surface interface. The SLS crystallization method is disclosed in detail by Robert S. Sposilli, M. A. Crowder, and James S. Im, Mat. Res. Soc. Symp. Proc. Vol. 452, pp. 956-957, 1997.

In the SLS crystallization method, the amount of laser energy, the irradiation range of the laser beam, and the translation distance are controlled, so as to allow a predetermined length of lateral growth of the silicon crystal particle, thereby crystallizing the amorphous silicon into a single crystal. The irradiation device used in the SLS crystallization method concentrates the laser beam to a small and narrow region, and so the amorphous silicon layer deposited on the substrate cannot be simultaneously changed into polycrystalline. Therefore, in order to change the irradiation position on the substrate, the substrate having the amorphous silicon layer deposited thereon is mounted on a stage. Then, after an irradiation in a predetermined area, the substrate is translated so as to allow an irradiation to be performed on another area, thereby carrying out the irradiation process on the entire surface of the substrate. Alternatively, the laser may be mounted on a stage allowing it to move relative to the substrate.

FIG. 2 is a schematic view illustrating a general SLS (Sequential Lateral Solidification) device. Referring to FIG. 2, the general SLS device includes a laser beam generator 1 for generating a laser beam, a focusing lens 2 for focusing the laser beam generated from the laser beam generator 1, a mask 3 for irradiating the laser beam to a substrate 10, and a reduction lens 4 for reducing the laser beam passing through the mask 3 to a smaller size. The laser beam generator 1 generally generates a light beam with a wavelength of about 308 nanometers (nm) using XeCl or 248 nanometers (nm) using KrF in an excimer laser. The laser beam generator 1 discharges an untreated laser beam. The discharged laser beam passes through an attenuator (not shown), in which the energy intensity is controlled. The laser beam is then irradiated to the focusing lens 2.

The substrate 10 having an amorphous silicon layer deposited thereon is fixed to an X-Y stage 5, which faces the mask 3. In order to crystallize an entire surface of the substrate 10, the X-Y stage is minutely displaced, thereby gradually expanding the crystallizing region. The mask 3 includes an open part 'A' allowing the laser beam to pass through, and a closed part 'B' absorbing the laser beam. The width of the open part 'A' determines the lateral growth length of the grains formed after the first exposure.

A method for crystallizing silicon using the general SLS device of FIG. 2 according to the related art will be described as follows. FIG. 3 is a cross-sectional view schematically illustrating the laser crystallizing process according to the related art. As shown in FIG. 3, a buffer layer 21 and an amorphous silicon layer 22 are sequentially formed on a substrate 20. Then, a mask (not shown) with sequentially alternating open parts and closed parts is placed over the substrate 20 having the amorphous silicon layer 22 deposited thereon. Thereafter, the laser irradiation process is performed on the amorphous silicon layer 22. The amorphous silicon layer 22 is generally deposited on the substrate 20 by a chemical vapor deposition (CVD) method, which results in a high content of hydrogen within the amorphous silicon layer 22 immediately after the deposition. However, when heated, hydrogen tends to escape from the thin film. Therefore, a primary heat treatment may be carried out on the amorphous silicon layer 22 in order to perform the dehydrogenation process. When the hydrogen is not eliminated during a prior process, the surface of the crystallized silicon layer becomes rough, thereby resulting in the poor electrical characteristics.

Hereinafter, a method for crystallizing the silicon by using the mask having the alternating open and closed parts of the same width in the aforementioned general SLS device will be described as follows. FIG. 4 is a plan view illustrating a related art mask. Referring to FIG. 4, the related art mask includes a plurality of open parts A and closed parts B, wherein the open and closed parts A and B alternate. The width of the open and closed parts A and B may be controlled. In FIG. 4, the width of the open part A is similar to that of the closed part B. Because there may be uncrystallized portions of the amorphous silicon layer left after the primary laser irradiation process, a second laser irradiation process is performed thereto. In the aforementioned silicon crystallization process, the size of crystal particle grown in the X-axis direction or Y-axis direction on the substrate is limited to 0.3 μm to 1 μm. Thus, a silicon crystallization process for producing large-sized crystal particles having great mobility characteristics is proposed by the crystallizing the substrate in the Y-axis direction after completion of the crystallization in the X-axis direction by moving the substrate.

Hereinafter, the silicon crystallization process performed in the X-axis and Y-axis directions will be described as follows. FIG. 5A to FIG. 5E are plan views illustrating a related art method for crystallizing the silicon by using the mask of FIG. 4. In FIG. 5A to FIG. 5E, the arrow designates a direction that the crystallization proceeds. Also, a substrate 30 is moved along the X-axis or the Y-axis by moving a stage having the substrate 30 placed thereon.

As shown in FIG. 5A, a mask 25 is placed above the substrate 30, and one laser pulse is irradiated thereon, whereby crystallation regions are formed on a first crystallizing block H of the substrate 30 depending upon the number of open parts A of the mask 25. In this case, each first crystallizing block H has a width 'L' and a length 'S'. Generally, a laser beam irradiation device places a reduction lens below the mask 25, whereby a laser beam pattern irradiated on the substrate 30 through the mask 25 is reduced by a constant rate of the reduction lens. For example, if the reduction rate is '5', as shown in FIG. 4, and a length and a width of the open part A are set as 'l' and 's', one part on the crystallizing block H irradiated with the laser beam through the open part A of the mask has a length of l/5 and a width of s/5. As one laser pulse is irradiated onto the substrate through the mask 25, the crystallization process is carried out with the first crystallizing block H having the width 'L' and the length 'S'.

As shown in FIG. 5A, after arranging the mask 25 corresponding to the substrate 30, the substrate 30 is moved along the X-axis direction to the right a distance corresponding to the width L of the first crystallizing block H (①), thereby carrying out the crystallization on a number of lines corresponding to the number of the open parts A of the mask 25.

As shown in FIG. 5B, after completing the crystallization for the open parts A along the X-axis direction to the right, the substrate 30 is moved upward along the Y-axis direction a distance corresponding to a width 't' of one part in the first crystallizing block H (②). Subsequently, the substrate 30 is moved along the X-axis direction to the left a distance corresponding to the width L of the first crystallizing block H (③), whereby the crystallization proceeds on the substrate in areas corresponding to the number of the open parts A of the mask 25. Upon completion of the crystallization along a horizontal direction of the substrate 30, a crystallization using the open parts A along a vertical direction of the substrate 30 a distance corresponding to (S+t) is carried out. Subsequently, after moving the substrate 30 upward along the Y-axis direction at a range corresponding to the length S of the first crystallizing block H, the process of (①) to (③) is repetitively performed to completely crystallize the entire surface of the substrate on the X-axis direction.

Referring to FIG. 5C, when the crystallization in the X-axis direction on the substrate 30 is completed, the substrate 30 is rotated at 90°. Then, as shown in FIG. 5D, after arranging the mask 25 corresponding to the substrate 30, the substrate 30 is moved along the X-axis direction towards the right a distance corresponding to the width L of the first crystallizing block H, to carry out the crystallization on a number of lines corresponding to the number of the open parts A of the mask 25. When the substrate is rotated at 90° during the crystallization process such as explained in FIG. 5A, the grains primarily grown in one direction on the substrate act as seeds to further crystal growth in a direction perpendicular to the previous crystals, thereby increasing the size of the grains.

After completing the crystallization in the X-axis direction to the right corresponding to the open parts A along a horizontal direction of the substrate 30 (which corresponds to the vertical direction of the substrate 30 in FIG. 5A), as shown in FIG. 5E, the substrate 30 is moved upward along the Y-axis direction a distance corresponding to the width 't' of one part in the first crystallizing block H (⑥). Then, the substrate 30 is moved along the X-axis direction to the left a distance corresponding to the width L of the first crystallizing block H (⑦), to carry out the crystallization on a number of lines corresponding to the number of the open parts A of the mask 25. Accordingly, when the crystallization in the X-axis direction to the left is completed along the horizontal direction of the substrate 30, the crystallization process continues after moving the substrate 30 vertically a distance corresponding to (S+t). After the substrate 30 is moved upward along the Y-axis direction a distance corresponding to the length S of the first crystallizing block H, the aforementioned process including (⑥) is repetitively performed to complete the crystallization on the entire surface of the substrate 30 perpendicular to the first crystallization direction.

Generally, the crystallization process is carried out where the mask is in a fixed state, and the substrate 30 is moved for crystallization. At this time, the substrate 30 is moved in a direction opposite to the direction of the crystallization (the arrow direction). That is, in case of (①), the crystallization progresses on the substrate 30 through the mask as the substrate 30 is moved along the X-axis direction to the right a distance corresponding to the beam length L of the open part A. During the process of (②), the substrate 30 is moved upward along the Y-axis direction a distance corresponding to half (½) of the total width of the open and closed parts ((a+b)/2), and then again moved along the X-axis direction to the left a distance corresponding to the beam length L of the open part A, whereby the crystallization proceeds on the substrate 30 through the mask. Accordingly, after the crystallization on the substrate 30 corresponding to the mask along the X-axis direction through the movement of (①) to (③), the substrate 30 is moved upward along the Y-axis direction at the range corresponding to the length of the mask, so that the crystallization is progressed again through the process of (①) to (③).

However, the related art laser crystallization device and the method for crystallizing the silicon by using the same have the following disadvantages.

In the process of the X-axis and the Y-axis directions for improving the device characteristics, the crystallization on the substrate is progressed along the X-axis direction with the laser crystallization device including the mask having the open parts of the same shape, and then the substrate is rotated at 90° for crystallization in the perpendicular direction. However, if the substrate is large, it is difficult to rotate the substrate. Also, the process of rotating the substrate takes long time, thereby increasing the time for crystallizing the silicon on the substrate.

SUMMARY OF THE INVENTION

Accordingly, the present invention is directed to a laser crystallization device and a method for crystallizing silicon by using the same that substantially obviates one or more problems due to limitations and disadvantages of the related art.

An object of the present invention is to provide a laser crystallization device and a method for crystallizing silicon by using the same, to carry out the crystallization process in both the X-axis and Y-axis directions without rotation of a stage.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a laser crystallizing device includes a mask including first and second regions, the first region having an open part oriented in the X-axis direction, and the second region having an open part oriented in the Y-axis direction.

In another aspect, a method for crystallizing silicon includes positioning a substrate having an amorphous silicon layer on a stage; arranging a mask corresponding to the substrate to form first and second crystallizing blocks on irradiation of laser beam, the mask including a first region having a plurality of open parts oriented along the X-axis direction, and a second region having a plurality of open parts oriented along the Y-axis direction; crystallizing the substrate along the X-axis direction of when the first region is opened, and the stage is moved along the X-axis direction; and crystallizing the substrate along for the Y-axis direction of when the second region is opened, and the stage is moved along the Y-axis direction.

In another aspect, a method for crystallizing silicon includes positioning a substrate having an amorphous silicon layer on a stage; arranging a mask having first and second crystallizing blocks, the mask including first and second regions each divided into two parts having open parts at complimentary positions; crystallizing the substrate in the X-axis direction of the substrate when the first region is opened, and the stage is moved along the X-axis direction; and crystallizing the substrate in the Y-axis direction of the substrate when the second region is opened, and the stage is moved along the Y-axis direction.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

A laser crystallization device according to the present invention and a method for crystallizing silicon by using the same will be described with reference to the accompanying drawings.

Figure 6:
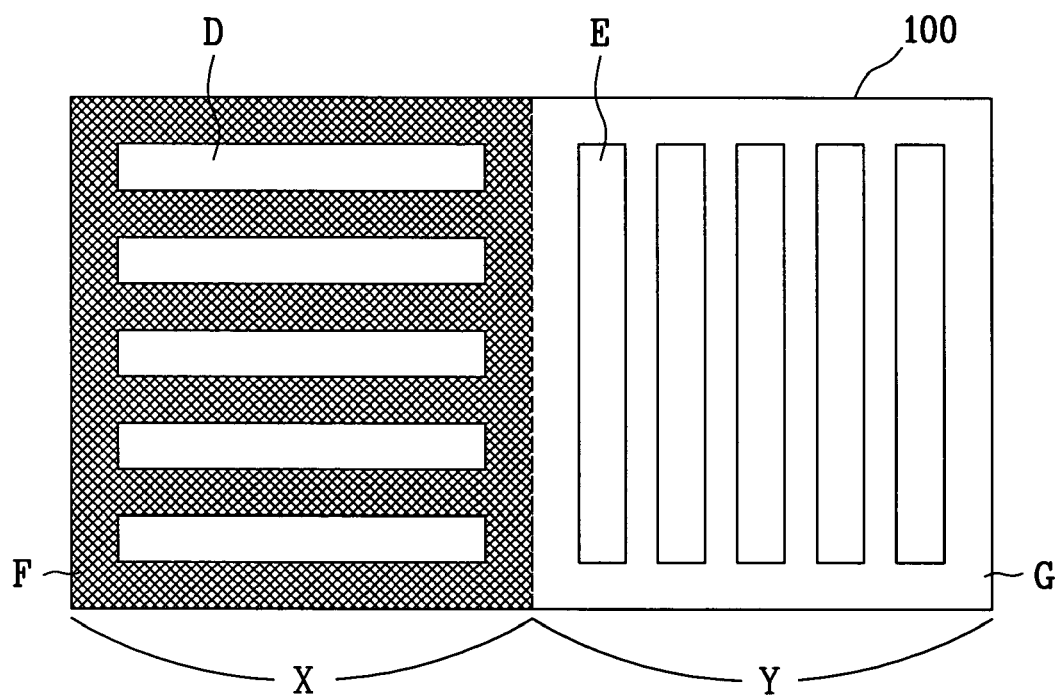
FIG. 6 is a plane view illustrating a mask of a laser crystallization device according to the first embodiment of the present invention.

FIG. 6 is a plan view illustrating a mask of a laser crystallization device according to the first embodiment of the present invention. As shown in FIG. 6, a mask 100 of the laser crystallization device according to the first embodiment of the present invention includes a first region (X) and a second region (Y). In the first region (X), a plurality of open parts (D) are arranged along the Y-axis direction, wherein a longitudinal direction of each open part (D) corresponds to the X-axis direction. In the second region (Y), a plurality of open parts (E) are arranged along the X-axis direction, wherein a longitudinal direction of each open part (E) corresponds to the Y-axis direction. The first and second regions (X) and (Y) of the mask 100 have closed parts (F) and (G). At this time, the plurality of open parts (D) and (E) are formed with the same shape in parallel within the respective first and second regions (X) and (Y).

Figure 1:
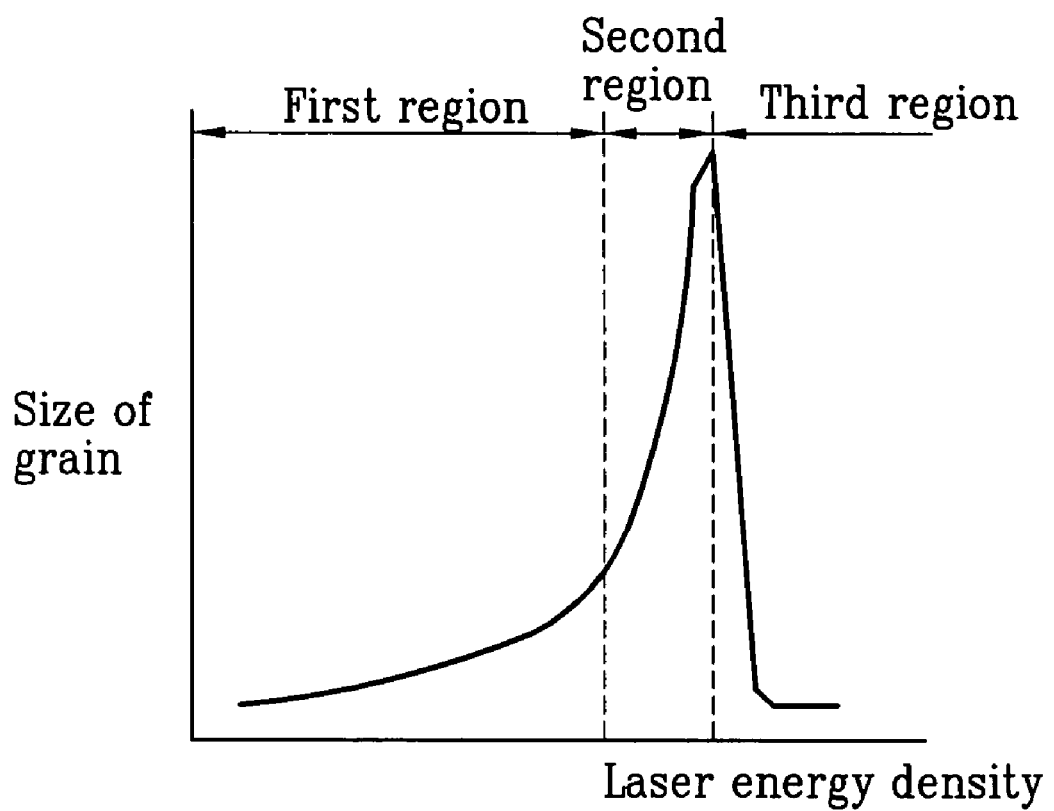
FIG. 1 is a graph illustrating the size of an amorphous silicon grain vs. laser energy density.
Figure 2:
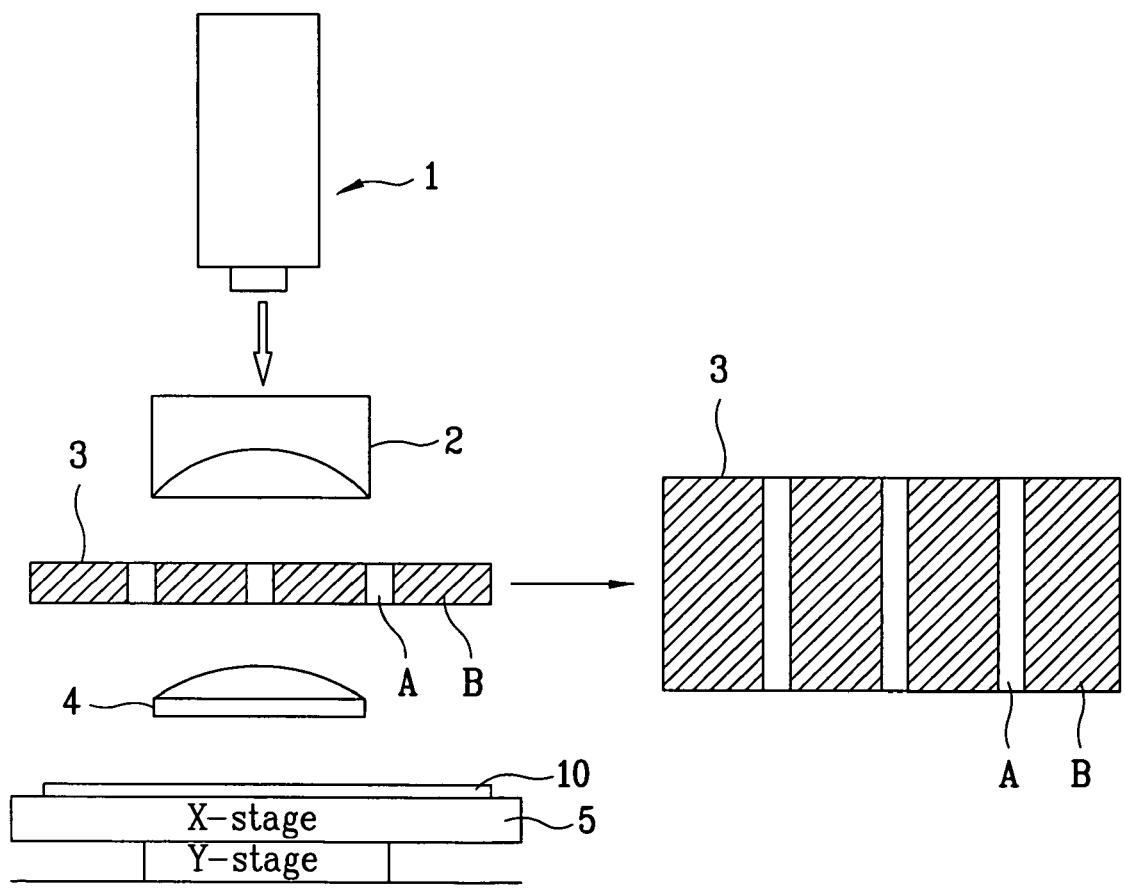
FIG. 2 is a schematic view illustrating a general SLS device.
Figure 3:
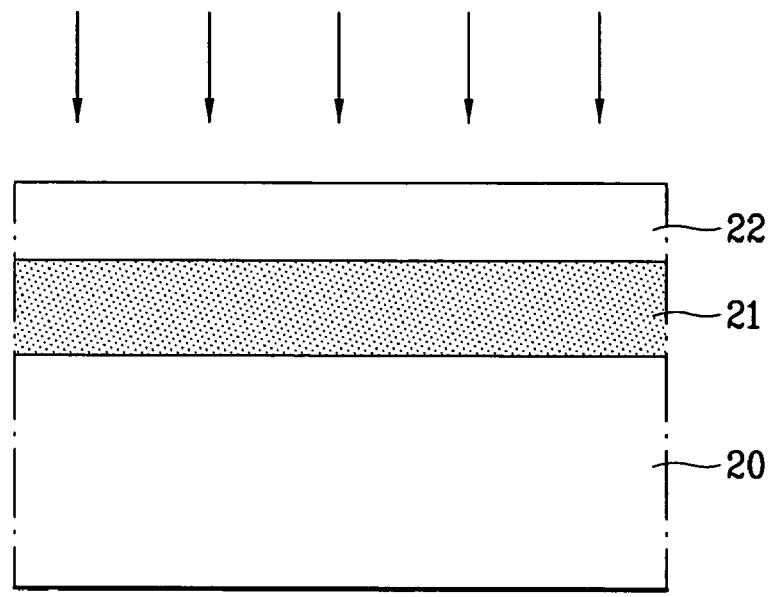
FIG. 3 is a cross-sectional view schematically illustrating the laser crystallization process according to the related art.
Figure 4:
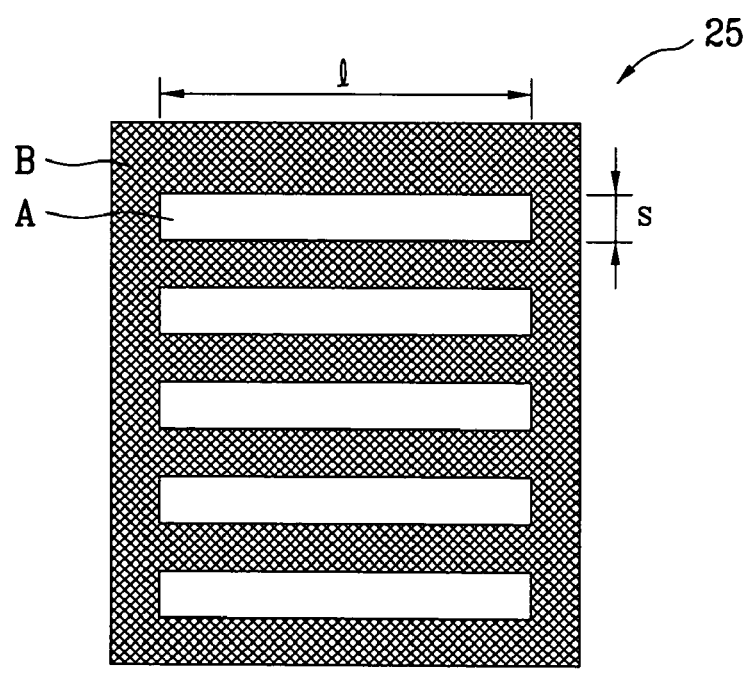
FIG. 4 is a plane view illustrating a mask according to the related art.
Figure 5A:
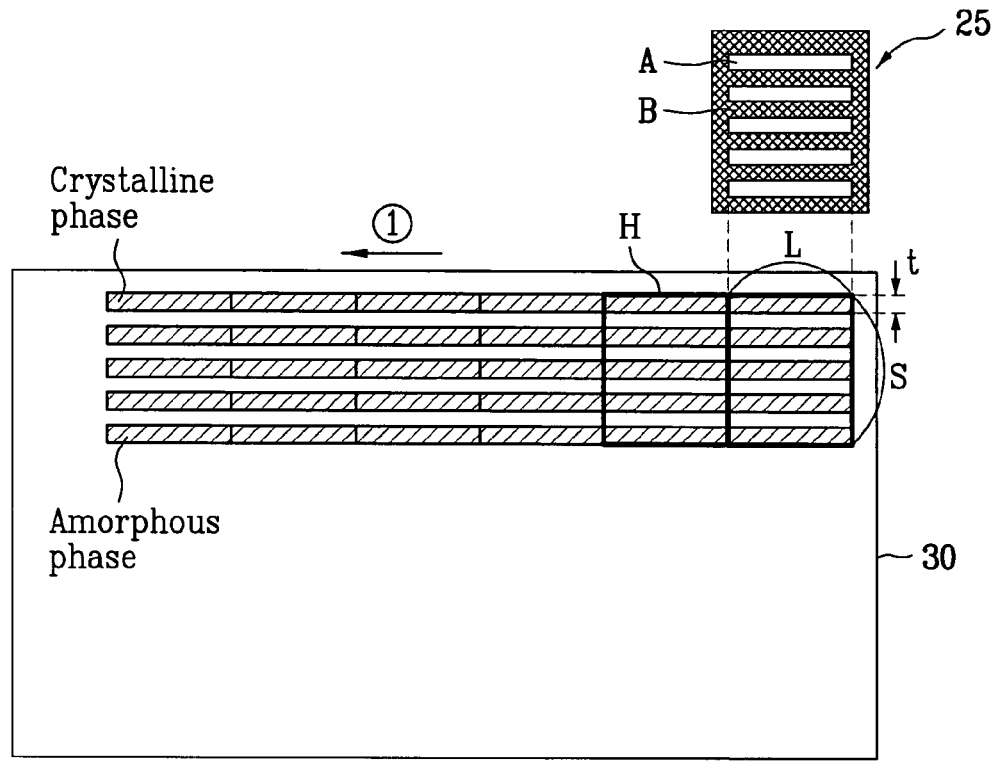
FIG. 5A to FIG. 5E are plane views illustrating a method for crystallizing silicon according to the related art using the mask of FIG. 4.
Figure 5B:
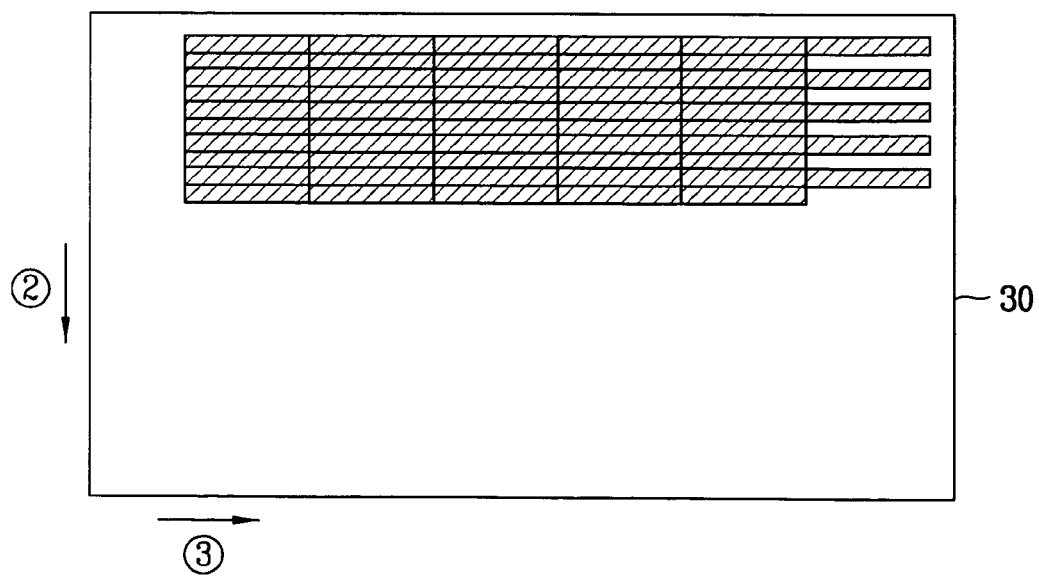
Figure 5C:
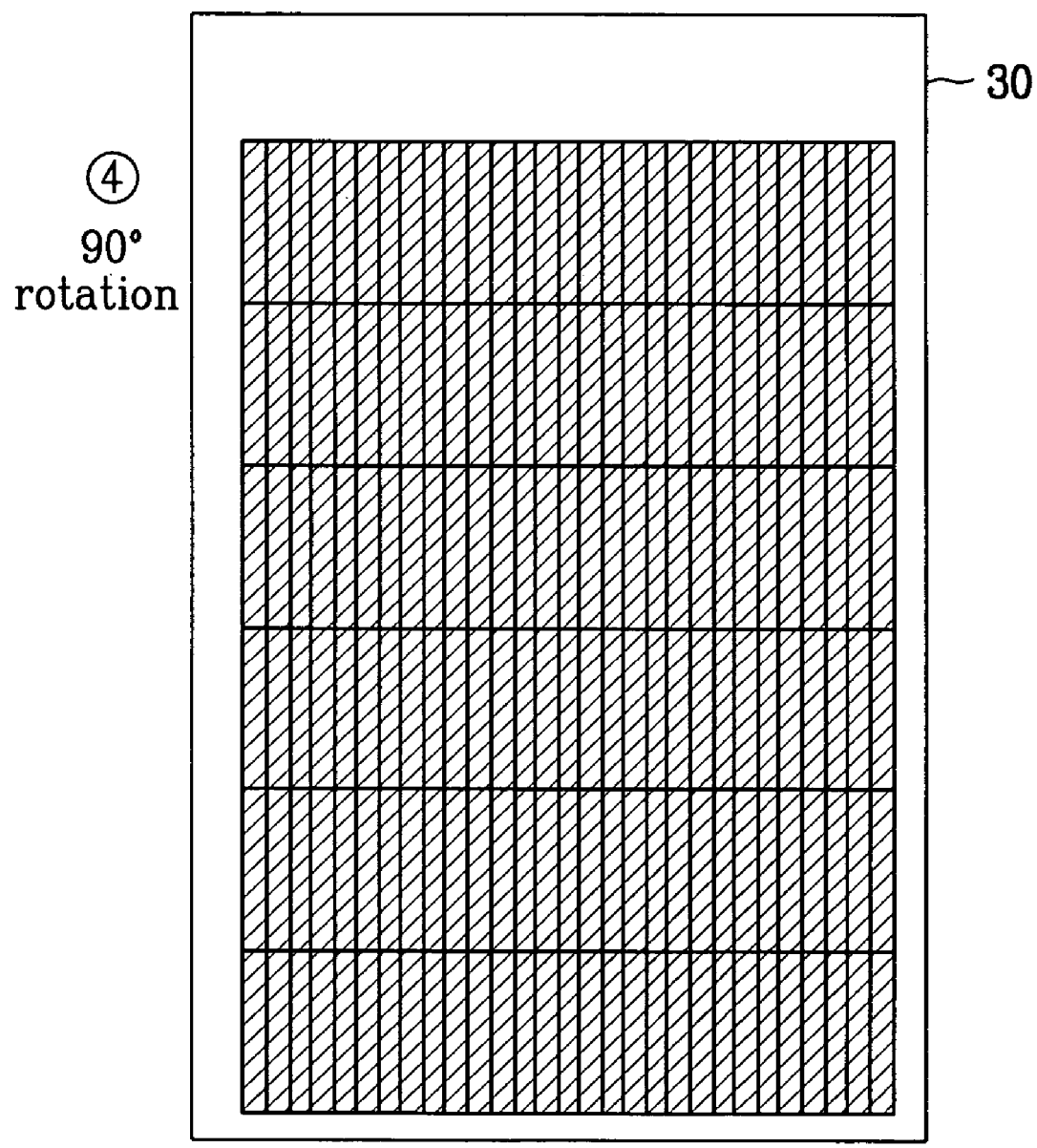
Figure 5D:
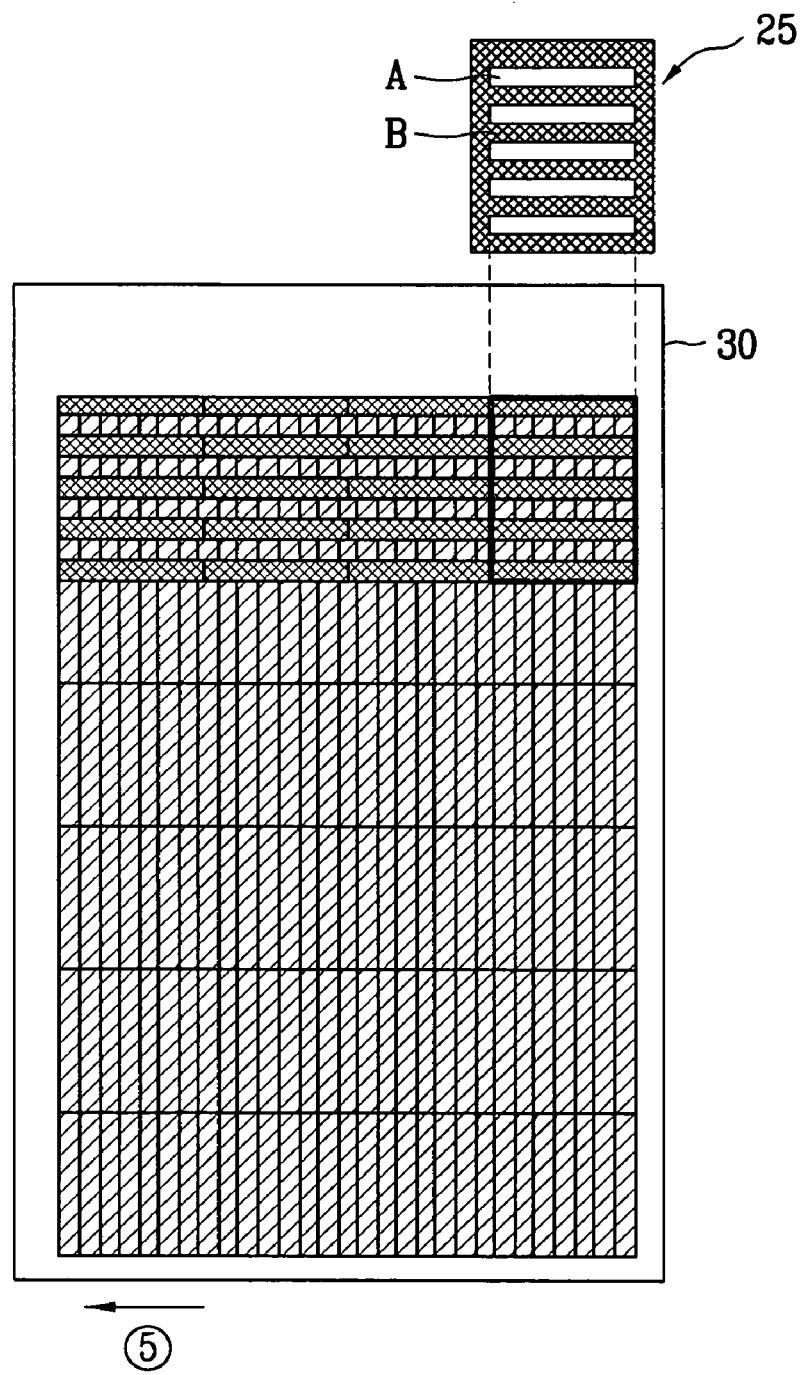
Figure 5E:
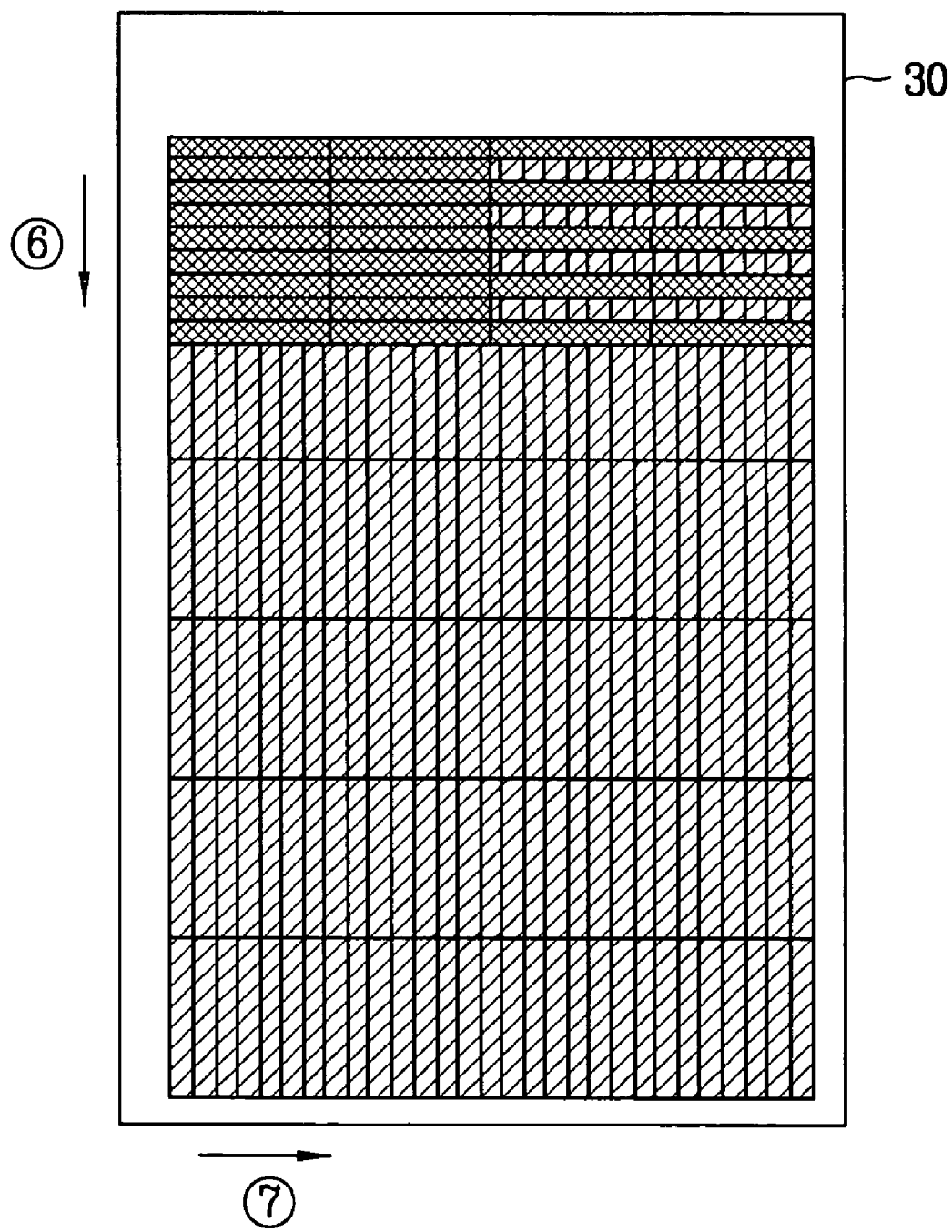

Referring to FIG. 2, the laser crystallization device includes a laser beam generator for generating laser beam, a focusing lens for condensing the laser beam from the laser beam generator, the aforementioned mask 100 that allows the laser beam to irradiate certain areas of a substrate, and a reduction lens for reducing the laser beam passing through the mask 100 at a constant rate. Furthermore, there is a light-shielding pattern (not shown) for selectively masking one of the first and second regions above or below the mask 100, and a stage for moving the corresponding substrate for crystallization along the X-axis and Y-axis directions. Depending upon in which direction crystallization is proceeding, one of the first and second regions is selectively masked, and the remaining region is opened to transmit the laser beam. Thus, when the crystallizing process is carried out and the substrate is moved along the X-axis direction, the first region of the mask is opened. In the meantime, when the crystallizing process is carried out and the substrate is moved along the Y-axis direction, the second region of the mask is opened.

In FIG. 6, each open part (D) and (E) of the first and second regions (X) and (Y) is formed with a similar width to that in each closed part (F) and (G). By using the aforementioned mask 100, the stage is moved along one portion of the substrate a distance corresponding to the width of the open part (D) and (E), and the laser beam irradiates the substrate two times, thereby completing the crystallization in one direction of the substrate. At this time, it is possible to vary the width of the open parts (D) and (E). If the width of the open part (D) and (E) is smaller than that of the closed part, the open part of the mask is positioned by moving the stage two times or more to crystallize one block, and then the laser beam is irradiated thereto, thereby completing the crystallization in one direction.

FIG. 7A to FIG. 7E are plan views illustrating a method for crystallizing silicon according to the first embodiment of the present invention by using the mask of FIG. 6. In FIG. 7A to FIG. 7E, an arrow direction designates a crystallization direction, whereby the stage having the substrate thereon is moved in an opposite direction to the crystallization direction.

First, an amorphous silicon layer is formed on an entire surface of the substrate 110, and then the substrate 100 is positioned on the stage (not shown). Subsequently, the mask 100 is arranged, as shown in FIG. 6, the mask including the first region (X) having the open part (D) in the X-axis direction, and the second region (Y) having the open part (E) in the Y-axis direction, so that the first and second regions (X) and (Y) are positioned in different orientations. The laser beam irradiates the substrate 110 through the mask 100 to obtain first and second crystallizing blocks. In the first crystallizing block, one laser pulse is transmitted through the first region of the mask, and irradiated to the substrate. In the second crystallizing block, one laser pulse is transmitted through the second region of the mask, and irradiated to the substrate. Meanwhile, each crystallizing block is formed on the substrate with a size corresponding to the size of the open part divided by the constant rate of the reduction lens of the laser crystallization device.

Figure 7A:
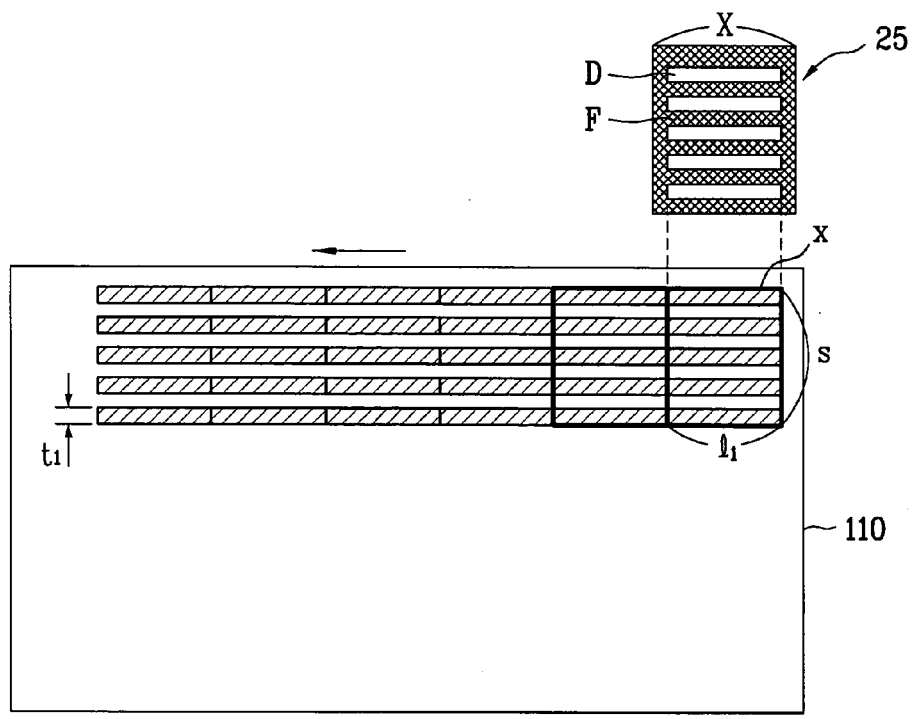
FIG. 7A to FIG. 7E are plane views illustrating a method for crystallizing silicon according to the first embodiment of the present invention using the mask of FIG. 6.

As shown in FIG. 7A, the crystallizing process proceeds with the first region (X) of the mask 100 opened, and the stage is moved along the X-axis direction to the right a distance corresponding to a length $l_1$ of one part in the first crystallizing block x. The crystallization proceeds in a direction opposite to the direction that the stage moves (the arrow direction). When the substrate 100 is moved along the X-axis direction to the right relative to the fixed mask 100, the laser irradiation on the substrate 100 proceeds in the X-axis direction to the left.

Figure 7B:
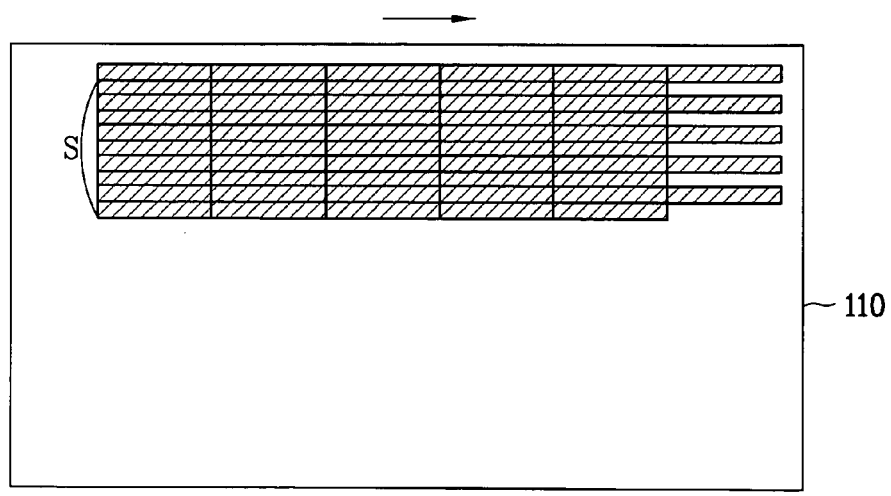

As shown in FIG. 7B, after completing the movement of the substrate 100 along the X-axis direction to the right, the stage is moved upward along the Y-axis direction a distance $t_1$ corresponding to the width of one part in the first crystallizing block x. Subsequently, the crystallizing process is carried out when the first region of the mask 100 is opened, and the stage is moved along the X-axis direction to the left a distance corresponding to the length $l_1$ of one part in the first crystallizing block x. The crystallization then proceeds in a direction opposite to the direction that the stage moves (the arrow direction). Then, after the laser beam is irradiated when moving the substrate 100 along the X-axis direction to the left in a horizontal direction of the substrate 100, the stage is moved upward along the Y-axis direction a distance corresponding to a length S of the first crystallizing block x. Subsequently, the crystallizing process is carried out when the first region (X) of the mask 100 is opened, and the stage is moved along the X-axis direction to the right a distance corresponding to the length $l_1$ of one part in the first crystallizing block x. Thus, the process explained in FIG. 7A and FIG. 7B is repeatedly carried out, thereby completing the crystallizing process in the X-axis direction of the substrate.

Figure 7C:
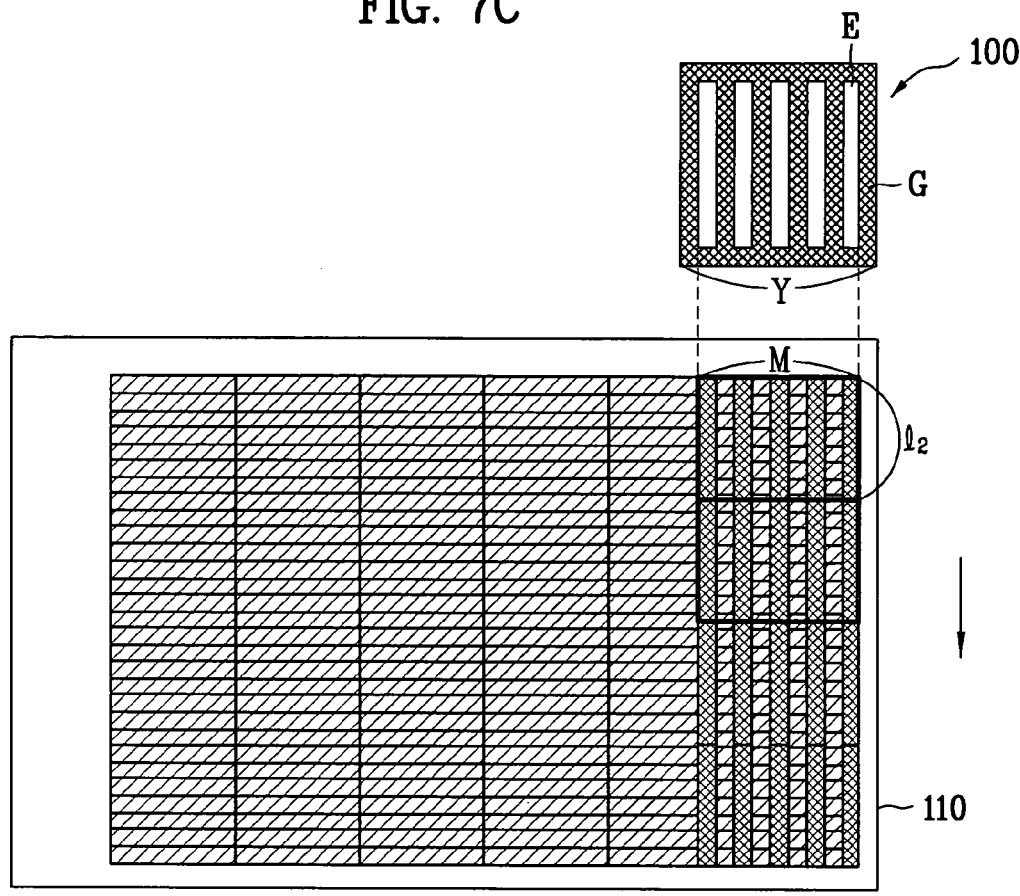

As shown in FIG. 7C, the crystallizing process is carried out when the second region (Y) of the mask 100 is opened and the stage is moved upward along the Y-axis direction a distance corresponding to a length $l_2$ of one part in the second crystallizing block y. The crystallization proceeds in a direction opposite to the direction that the stage moves (the arrow direction). After completing the movement of the stage upward along the Y-axis direction of the substrate 100, the stage is moved along the X-axis direction to the right a distance $t_2$ corresponding to the width of one part in the second crystallizing block y.

Figure 7D:
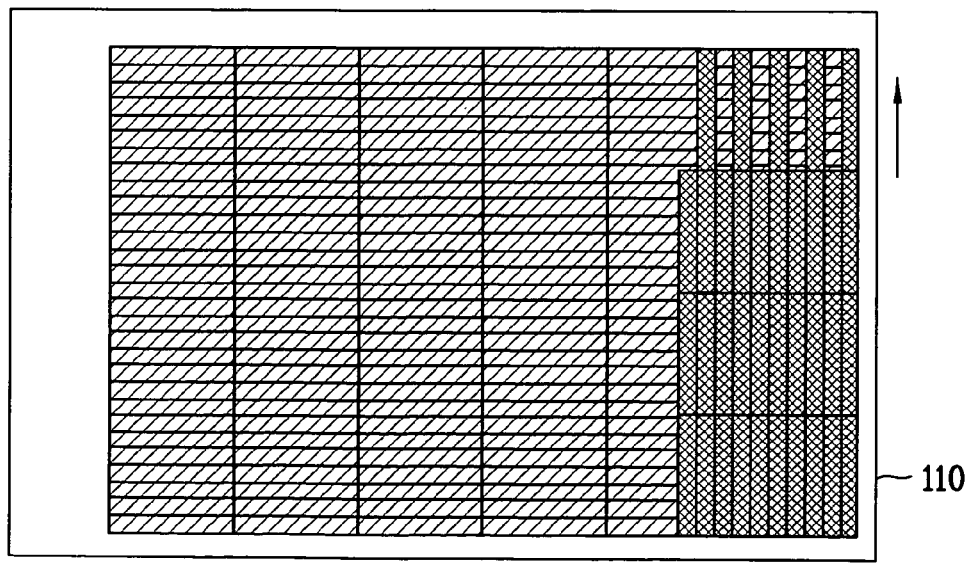
Figure 7E:
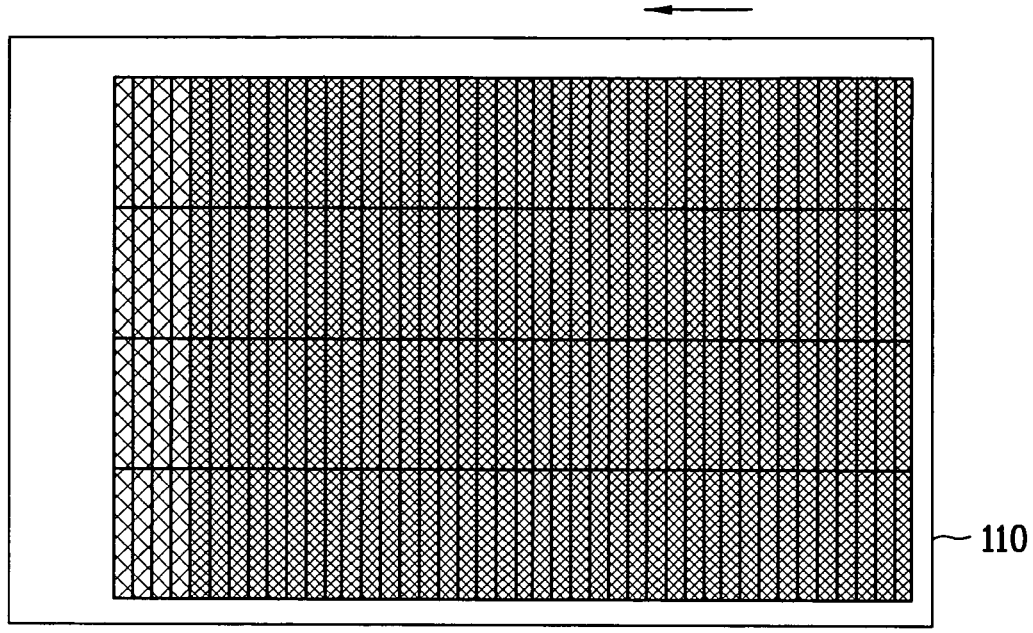

As shown in FIG. 7D, the crystallizing process is carried out when the second region of the mask 100 is open, and the stage is moved downward along the Y-axis direction a distance corresponding to the length $l_2$ of one part in the second crystallizing block y. After completing the movement of the stage downward along the Y-axis direction of the substrate 100, as shown in FIG. 7E, the stage is moved along the X-axis direction to the right a distance corresponding to a length M of the second crystallizing block y. Subsequently, the process explained in FIG. 7C to FIG. 7E is repetitively carried out, thereby completing the crystallizing process in the Y-axis direction.

Figure 8:
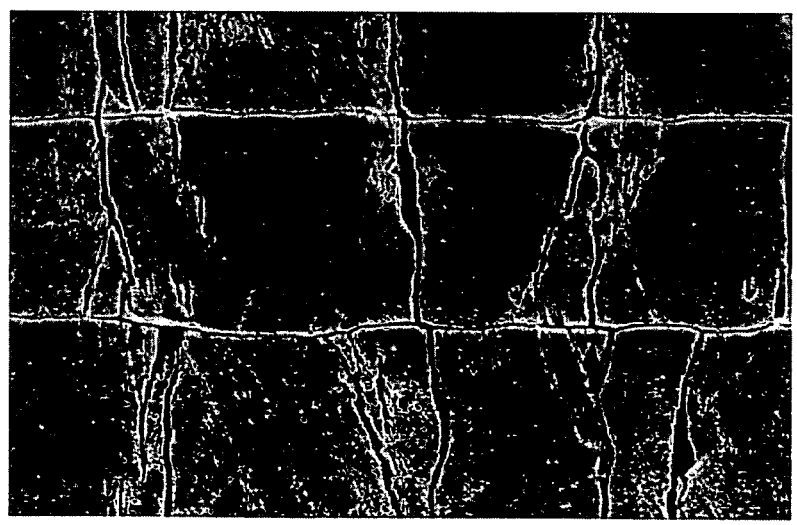
FIG. 8 is an SEM illustrating crystalline silicon according to a method for crystallizing silicon according to the present invention.

FIG. 8 is an SEM picture illustrating the crystalline silicon structure according to a method for crystallizing silicon according to the present invention. According to the process of FIG. 7A to FIG. 7E, the silicon layer is crystallized by using the mask including the first region having the open part in the X-axis direction and the second region having the open part in the Y-axis direction according to the present invention. Referring to FIG. 8, grains grow in the X-axis and Y-axis directions, whereby it is possible to obtain crystalline silicon having great mobility in all directions.

Figure 9:
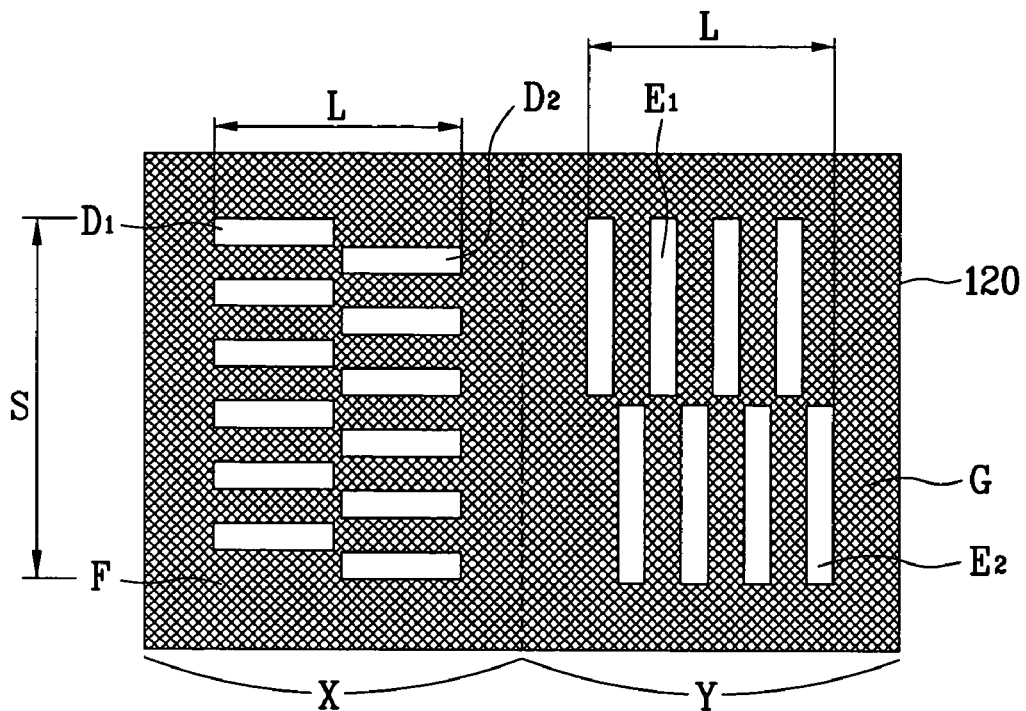
FIG. 9 is a plane view illustrating a mask of a laser crystallization device according to the second embodiment of the present invention.

FIG. 9 is a plan view illustrating a mask of a laser crystallizing device according to a second embodiment of the present invention. As shown in FIG. 9, the laser crystallizing device according to the second embodiment of the present invention includes a mask 120 having a first region X and a second region Y. In the first region X of the mask 120, open parts $D_1$ and $D_2$ are formed at complimentary positions along the X-axis direction. In the second region Y of the mask 120, open parts $E_1$ and $E_2$ are formed at complimentary positions along the Y-axis direction. At this time, the plurality of open parts $D_1$, $D_2$, $E_1$, and $E_2$ are formed in the first and second regions X and Y respectively, and the remaining portions of the mask 120 are defined as closed parts F and G. A total width of the open parts $D_1$ and $D_2$ of the first region X is defined as 'L', and a total length thereof is defined as 'S'. Each open part $D_1$ or $D_2$ has a length corresponding to L/2. Also, the open parts $D_1$ and $D_2$ having the same shape are reversely formed at lower and upper directions within the first region X, and the open parts $E_1$, and $E_2$ having the same shape are complimentarily formed at lower and upper directions within the second region Y.

A method of crystallizing amorphous silicon according to the second embodiment of the present invention by using the mask 120 of FIG. 9 will be described as follows.

Figure 10:
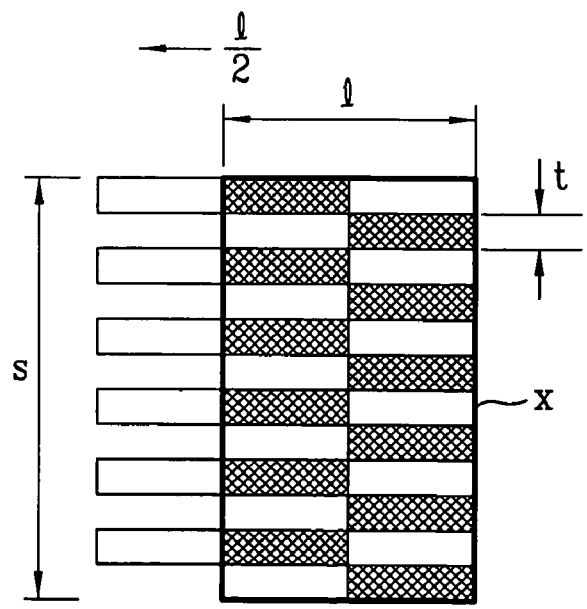
FIG. 10 is a plane view illustrating a crystallization region after irradiating laser to a substrate two times by using the mask of FIG. 9.

FIG. 10 is a plan view illustrating a crystallizing block after irradiating the laser beam two times using the mask of FIG. 9. As shown in FIG. 10, the laser beam is firstly irradiated onto the substrate when the first region X of the mask is opened, thereby obtaining a crystallizing block x corresponding to the open parts $D_1$ and $D_2$ of the first region X. At this time, the crystallizing block has a size reduced by a constant rate due to a reduction lens provided below the mask 120. Accordingly, the first crystallizing block x of the substrate corresponding to the open parts $D_1$ and $D_2$ has a width 'l' and a length 's'. Subsequently, after moving the stage a distance (½ of the total width of the crystallizing block x) corresponding to the length (l/2) of one open part $D_1$ or $D_2$ of the mask 120, the second laser irradiation process is performed thereto. There is a laser beam overlap region having a width of l/2 and a length of 's' resulting from irradiating the laser beam to the substrate two times. If there are uncrystallized portions in the laser beam overlap region after the first laser irradiation process, a second laser irradiation process is performed thereto.

Accordingly, the third and fourth laser beam irradiation process is carried out when the stage having the substrate placed thereon is moved along the X-axis direction at the range corresponding to ½ of the first crystallizing block x, thereby completing the crystallizing process at the X-axis direction. As compared with the aforementioned method for crystallizing the silicon layer according to the first embodiment of the present invention explained with reference to FIG. 7A to FIG. 7E, the method of the second embodiment of the present invention may omit the process of moving the stage along the Y-axis direction a distance corresponding to the width 't' of one part in the crystallizing block along the X-axis.

In case of the method according to the second embodiment of the present invention, the crystallization process along the X-axis direction is carried out as follows. The crystallization process in the X-axis direction is carried out when the first region X of the mask 120 is opened, and the stage having the substrate thereon is moved ½ of the total width of the first crystallizing block x (l/2), thereby completing the crystallization along the length 's' direction of the first crystallizing block x. Subsequently, the crystallizing process is carried out when the stage is moved along the Y-axis direction a distance corresponding to the length 's' of the first crystallizing block x, and then moved along the X-axis direction a distance corresponding to ½ of the total width of the first crystallizing block x (l/2). Via repetition of the aforementioned process, the crystallizing process of the X-axis direction of the substrate is completed.

Next, the crystallization process in the Y-axis direction is carried out when the second region (Y) of the mask 120 is opened, and the laser beam is irradiated thereon, thereby forming a second crystallizing block (not shown). The crystallization process is carried out when the stage having the substrate thereon is moved along the Y-axis direction a distance corresponding to ½ (s/2) of the length 's' of the second crystallizing block, a length (S/2) of one open part ($E_1$ or $E_2$) in the second region (Y) of the mask 120, thereby completing the crystallization to the width 'l' of the crystallizing block x. Subsequently, the crystallization process is carried out when the stage is moved along the X-axis direction a distance corresponding to the width 'l' of the second crystallizing block, and then again moved along the Y-axis direction a distance corresponding to ½ (s/2) of the length of the second crystallizing block. Via to the repetition of the aforementioned process, the crystallization process in the Y-axis direction is completed.

In addition to the mask of the laser crystallization device explained with reference to FIG. 6 or FIG. 9, it is possible to form a mask including three open parts or more, having the different shapes, in respective first and second regions. That is, the mask is divided into the two regions, and open parts having the different shapes are formed in the respective regions. Then, the laser irradiation process is carried out when one of the two regions is selectively opened, and the other is masked, thereby crystallizing the silicon having the large-sized grain grown in both horizontal and vertical directions, without rotation of the stage.

As mentioned above, the laser crystallization device according to the present invention and the method for crystallizing the silicon by using the same have the following advantages. In the crystallization process in the X-axis and Y-axis directions for growing the size of grains, the mask of the laser crystallization device is divided into the two regions, whereby one is masked, and the other is opened during the crystallization. Accordingly, it is possible to carry out the crystallization process without rotation of the stage. Even though the substrate is formed with a large size, it is possible to decrease the problems in the equipment because the stage rotation step is omitted. Furthermore, it is possible to decrease the time for crystallization by omission of the stage rotation step, thereby improving yield.

It will be apparent to those skilled in the art that various modifications and variations may be made in the present invention. Thus, it is intended that the present invention covers the modifications and variations of this invention provided they come within the scope of the appended claims and their equivalents.

What is claimed is:

1. A method for crystallizing silicon comprising:
positioning a substrate having an amorphous silicon layer on a stage;
arranging a mask over the substrate, the mask including a first region having a plurality of open parts substantially oriented along the X-axis direction, and a second region having a plurality of open parts substantially oriented along the Y-axis direction, wherein the respective first and second regions of the mask have the open and closed parts having the same width;
blocking the second region of the mask and transmitting a laser beam through the mask to form a first crystallizing block in the amorphous silicon layer while moving one of the stage and the mask along the X-axis direction, wherein the first crystallizing block corresponds to a portion where one laser pulse passing through the first region of the mask is irradiated onto the amorphous silicon layer,
wherein the crystallization process for the X-axis direction includes:
crystallizing the amorphous silicon layer when the first region of the mask is opened, and the stage is moved along the X-axis direction a distance corresponding to the length of one part in the first crystallizing block;
moving the stage along the Y-axis direction a distance corresponding to the width of one part in the first crystallizing block after completing the movement of the stage in the X-axis direction;
crystallizing the amorphous silicon layer when the first region of the mask is opened, and the stage is moved along the X-axis direction in the opposite direction a distance corresponding to the length of one part in the first crystallizing block; and
moving the stage along the Y-axis direction a distance corresponding to the width of the first crystallizing block after completing the movement of the stage in the X-axis direction of the substrate,
wherein the crystallization progress for the X-axis direction is repeatedly carried out; and
blocking the first region of the mask and transmitting a laser beam through the mask to form a second crystallizing block in the amorphous silicon layer while moving one of the stage and the mask along the Y-axis direction, wherein the second crystallizing block corresponds to a portion where one laser pulse passing through the second region of the mask is irradiated onto the amorphous silicon layer,
wherein the crystallization process for the Y-axis direction includes:
crystallizing the amorphous silicon layer when the second region of the mask is opened, and the stage is moved along the Y-axis direction a distance corresponding to the length of one part in the second crystallizing block;
moving the stage along the X-axis direction a distance corresponding to the width of one part in the second crystallizing block after completing the movement of the stage in the Y-axis direction;
crystallizing the amorphous silicon layer when the second region of the mask is opened, and the stage is moved along the Y-axis direction in the opposite direction a distance corresponding to the length of one part in the second crystallizing block; and
moving the stage along the X-axis direction a distance corresponding to the width of the second crystallizing block after completing the movement of the stage in the Y-axis direction of the substrate, wherein the crystallization process for the Y-axis direction is repeatedly carried out.

2. The method of claim 1, wherein each crystallizing block has a size corresponding to the size of a region divided by a constant rate of a reduction lens of a laser crystallizing device.

3. A method for crystallizing silicon comprising:

positioning a substrate having an amorphous silicon layer on a stage;

arranging a mask over the substrate, the mask including first and second regions each divided into two parts having open parts at complimentary positions;

blocking the second region of the mask and transmitting a laser beam through the mask while moving one of the stage and mask along the X-axis direction to form a first crystallizing block in the amorphous silicon layer, wherein a first crystallizing block corresponds to a portion where one laser pulse passing through the first region of the mask is irradiated onto the amorphous silicon layer; and blocking the first region of the mask and transmitting a laser beam through the mask while moving one of the stage and the mask along the Y-axis direction to form a second crystallizing block in the amorphous silicon layer, wherein a second crystallizing block corresponds to a portion where one laser pulse passing through the second region of the mask is irradiated onto the amorphous silicon layer, and wherein the crystallization along the Y-axis direction is performed by moving the stage along the Y-axis direction a distance corresponding to ½ of the length of the second crystallizing block.

4. The method of claim 3, wherein each crystallizing block has a size corresponding to the size of a region divided by a constant rate of a reduction lens of a laser crystallizing device.

5. The method of claim 3, wherein a crystallization along the X-axis direction is performed by moving the stage along the X-axis direction a distance corresponding to ½ of the width of the first crystallizing block.

6. method of claim 5, wherein the crystallization along the X-axis direction further includes moving the stage along the Y-axis direction a distance corresponding to the length of the first crystallizing block when the moving direction of the stage is changed along the X-axis.

7. The method of claim 3, wherein the crystallization along the Y-axis direction further includes moving the stage along the X-axis direction a distance corresponding to the width of the second crystallizing block when the moving direction of the stage is changed along the Y-axis.

* * * * *